(12) United States Patent
Danskin

(10) Patent No.: US 7,622,947 B1
(45) Date of Patent: Nov. 24, 2009

(54) REDUNDANT CIRCUIT PRESENTS CONNECTIONS ON SPECIFIED I/O PORTS

(75) Inventor: John M. Danskin, Cranston, RI (US)

(73) Assignee: NVIDIA Corporation, Santa Clara, CA (US)

( * ) Notice: Subject to any disclaimer, the term of this patent is extended or adjusted under 35 U.S.C. 154(b) by 341 days.

(21) Appl. No.: 11/549,597

(22) Filed: Oct. 13, 2006

Related U.S. Application Data

(63) Continuation-in-part of application No. 11/105,326, filed on Apr. 12, 2005, now Pat. No. 7,477,091, which is a continuation of application No. 10/741,243, filed on Dec. 18, 2003, now Pat. No. 6,879,207.

(51) Int. Cl.
G06F 17/50 (2006.01)
H03K 19/173 (2006.01)

(52) U.S. Cl. .............................. 326/38; 716/16; 716/17

(58) Field of Classification Search ............. 716/16–17; 326/37–39, 41, 44
See application file for complete search history.

(56) References Cited

U.S. PATENT DOCUMENTS

| | | | | |
|---|---|---|---|---|
| 4,920,497 | A * | 4/1990 | Upadhyaya et al. | 716/17 |
| 5,256,918 | A * | 10/1993 | Suzuki | 326/38 |
| 5,861,761 | A * | 1/1999 | Kean | 326/41 |
| 5,925,920 | A * | 7/1999 | MacArthur et al. | 257/530 |
| 6,034,536 | A * | 3/2000 | McClintock et al. | 326/10 |
| 6,091,258 | A * | 7/2000 | McClintock et al. | 326/10 |
| 6,166,559 | A * | 12/2000 | McClintock et al. | 326/10 |
| 6,167,558 | A * | 12/2000 | Trimberger | 716/16 |
| 6,237,131 | B1 * | 5/2001 | MacArthur et al. | 716/16 |
| 6,265,895 | B1 * | 7/2001 | Schleicher et al. | 326/40 |
| 6,314,551 | B1 * | 11/2001 | Borland | 716/17 |
| 6,433,579 | B1 * | 8/2002 | Wang et al. | 326/38 |
| 6,531,891 | B1 * | 3/2003 | Sun et al. | 326/41 |
| 6,567,969 | B1 * | 5/2003 | Agrawal et al. | 716/17 |
| 6,731,133 | B1 * | 5/2004 | Feng et al. | 326/41 |
| 6,747,479 | B1 * | 6/2004 | Coppola et al. | 326/41 |
| 6,774,669 | B1 * | 8/2004 | Liu et al. | 326/41 |
| 6,809,549 | B2 * | 10/2004 | Baxter | 326/39 |
| 6,826,741 | B1 * | 11/2004 | Johnson et al. | 716/12 |
| 6,828,824 | B2 * | 12/2004 | Betz et al. | 326/47 |
| 6,861,865 | B1 * | 3/2005 | Carlson | 326/10 |
| 6,870,396 | B2 * | 3/2005 | Lien et al. | 326/41 |
| 6,933,747 | B1 * | 8/2005 | Bauer et al. | 326/38 |
| 7,005,888 | B1 * | 2/2006 | Baxter | 326/41 |
| 7,125,140 | B2 * | 10/2006 | Koch et al. | 362/205 |
| 7,129,744 | B2 * | 10/2006 | Madurawe | 326/38 |
| 7,137,095 | B1 * | 11/2006 | Liu et al. | 716/12 |
| 7,149,996 | B1 * | 12/2006 | Lysaght et al. | 716/16 |
| 7,157,936 | B2 * | 1/2007 | Chauhan et al. | 326/41 |

(Continued)

Primary Examiner—Stacy A Whitmore
(74) Attorney, Agent, or Firm—Patterson & Sheridan, LLP

(57) ABSTRACT

A method and apparatus for utilizing redundant circuitry on integrated circuits (ICs) that may increase manufacturing yields, while maintaining a predetermined set of interfaces for connection with external circuitry without drastically increasing die area and circuit complexity are provided. In this manner, even though an IC may have defects which would otherwise render it inoperable, embodiments of the present invention allow the defects to be circumscribed or avoided while still maintaining a predetermined set of interfaces, thus providing for an operational circuit. Various embodiments further provide a method for sorting or separating devices based on their level of functionality or performance, which in turn depends on their number of defects and the desired number of interfaces.

11 Claims, 15 Drawing Sheets

U.S. PATENT DOCUMENTS

| | | | |
|---|---|---|---|
| 7,157,938 B2 * | 1/2007 | Feng et al. | 326/41 |
| 7,205,785 B1 * | 4/2007 | Carlson | 326/8 |
| 7,265,573 B1 * | 9/2007 | Wright | 326/8 |
| 7,342,416 B2 * | 3/2008 | Feng et al. | 326/41 |
| 7,386,826 B1 * | 6/2008 | Keller et al. | 716/16 |
| 7,409,669 B1 * | 8/2008 | Dastidar et al. | 716/16 |
| 7,426,665 B1 * | 9/2008 | Lien et al. | 714/725 |
| 7,432,734 B2 * | 10/2008 | Lewis et al. | 326/41 |
| 2001/0009029 A1 * | 7/2001 | Farnworth et al. | 714/718 |
| 2003/0080777 A1 * | 5/2003 | Baxter | 326/39 |
| 2003/0198180 A1 * | 10/2003 | Cambron | 370/216 |
| 2003/0218479 A1 * | 11/2003 | Feng et al. | 326/41 |
| 2004/0017222 A1 * | 1/2004 | Betz et al. | 326/41 |
| 2006/0114023 A1 * | 6/2006 | Ting et al. | 326/41 |
| 2006/0114024 A1 * | 6/2006 | Feng et al. | 326/41 |
| 2006/0152248 A1 * | 7/2006 | Madurawe | 326/41 |
| 2006/0186920 A1 * | 8/2006 | Feng et al. | 326/41 |
| 2006/0202714 A1 * | 9/2006 | Hoang et al. | 326/38 |
| 2007/0052444 A1 * | 3/2007 | Madurawe | 326/38 |
| 2007/0252617 A1 * | 11/2007 | Lewis et al. | 326/41 |
| 2008/0238477 A1 * | 10/2008 | Feng et al. | 326/41 |

* cited by examiner

REDUNDANT CIRCUIT PRESENTS CONNECTIONS ON SPECIFIED I/O PORTS

CROSS-REFERENCE TO RELATED APPLICATIONS

This application is a continuation-in-part of U.S. Ser. No. 11/105,326 filed Apr. 12, 2005 now U.S. Pat. No. 7,477,091 and entitled, "Defect Tolerant Redundancy," which is a continuation of U.S. Ser. No. 10/741,243, filed Dec. 18, 2003, now U.S. Pat. No. 6,879,207, issued Apr. 12, 2005, both of which are incorporated herein by reference in their entirety.

BACKGROUND OF THE INVENTION

1. Field of the Invention

Embodiments of the present invention generally relate to using redundant circuitry on integrated circuits in order to increase manufacturing yields and connect internal, functional circuit blocks with a predetermined set of interfaces.

2. Description of the Related Art

Integrated circuits are manufactured on wafers, which are typically made of silicon that undergoes several processing steps. Once wafer processing is complete, the integrated circuits on the wafer are tested. This testing procedure is known as wafer sort. After wafer sort, the integrated circuits (or the "die") are separated from one another, and the good die, those that pass wafer sort testing, are packaged. The packaged parts are retested in a procedure referred to as final test. The packaged parts that pass final test may then be used or sold.

It is desirable to have as many good die per wafer as possible. This helps amortize the expense of a wafer among a greater number of die, thus reducing per die costs. Unfortunately, in a conventional integrated circuit, one defective or nonfunctional circuit block out of many is enough to render an entire die inoperable.

This is particularly troublesome for large integrated circuits. The number of errors in processing, such as opens, shorts, crystal defects, metal bridging, and other problems, tend to increase exponentially proportional to die area. Thus, larger integrated circuits are more likely to have a defect than a smaller circuit. Also, since there are fewer die per wafer to start with, this higher rate of attrition has a particularly negative effect.

Therefore, it is desirable to include some number of redundant circuit blocks on an integrated circuit. If one circuit block is defective, the integrated circuit functionality can be retained if the redundant circuit block can be substituted for the defective block. But saving the functionality of an integrated circuit does not make economic sense if the overhead or cost in terms of die area of the redundant circuitry is such that the number of die per wafer is decreased significantly.

As another way to cope with a higher rate of attrition on larger integrated circuits, some manufacturers bin these components according to the number and location of faults tested during the wafer sort. As an example, FIG. 1A illustrates a portion of an integrated circuit 100 with four parallel circuit blocks 102, 104, 106, 108, such as memory controllers. These four circuit blocks 102, 104, 106, 108 all have a corresponding connection 110 (e.g. pins P1 to P4) to interface with circuitry (not shown) external to the integrated circuit 100. However, a fault occurring on the second circuit block 104 has been found during wafer sort, so only connections 110 labeled P1, P3, and P4 can be subsequently used. The connection 110 to the second circuit block 104 is labeled as a no connect (NC) in FIG. 1A to indicate that external circuitry should not be connected to it. Components with the same interface combination as tested during wafer sort may be binned together and sold to a particular customer.

Even though only a single fault has occurred, a fault on a different circuit block may require an entirely different interface for external circuitry. For example, FIG. 1B depicts a single fault on the third circuit block 106 for the same portion of the integrated circuit 100. With this failure, only connections 110 labeled P1, P2, and P4 should be used, and the connection 110 to the third circuit block 106 is labeled as an NC. Even though these two integrated circuits 100 of FIGS. 1A-B have the same performance with the same number of functional circuit blocks and possess only a single fault, they cannot be exchanged for one another on a circuit board having traces to external circuitry interfacing with P1 through P4. The required interfaces are different between the two example integrated circuits 100. Thus, the integrated circuit 100 of FIG. 1B has to be sorted into a different bin than that of FIG. 1A's integrated circuit 100. Such binning adds manufacturing costs and customer logistic complexity, whether redundant circuits are used or not.

Accordingly, what is needed are improved circuits, methods, and apparatus for utilizing redundant circuitry on integrated circuits to increase manufacturing yields, preferably all without drastically increasing die area and circuit complexity.

SUMMARY OF THE INVENTION

One embodiment of the present invention provides for an integrated circuit. The integrated circuit generally includes a plurality of parallel circuit blocks; one or more interfaces for communicating with an external device; and a selection circuit to selectively route signals between the circuit blocks and the interfaces, wherein the selection circuit is capable of routing signals between the plurality of circuit blocks and all of the interfaces or, if any one of the circuit blocks is nonfunctional, route signals between remaining circuit blocks and a predetermined set of the interfaces.

Another embodiment of the present invention provides a method of configuring an integrated circuit (IC) comprising a plurality of parallel circuit blocks, an equal number of interfaces, and selection circuitry configured to route a pathway between each of the circuit blocks and one of the interfaces. The method generally includes determining a number of nonfunctional circuit blocks in the plurality of parallel circuit blocks; if the number of nonfunctional circuit blocks is zero, controlling the selection circuitry to couple each of the plurality of parallel circuit blocks with a different one of the interfaces; and if the number of nonfunctional circuit blocks is less than or equal to a number of redundant circuit blocks in the plurality of parallel circuit blocks, controlling the selection circuitry to couple the remaining functional circuit blocks to a predetermined set of one or more interfaces no matter which circuit blocks are nonfunctional.

Yet another embodiment of the present invention provides for a computing system. The computing system generally includes one or more devices capable of external communication and at least one integrated circuit. The integrated circuit generally includes a plurality of parallel circuit blocks; one or more interfaces for communicating with the devices; and a selection circuit to selectively route signals between the circuit blocks and the interfaces, wherein the selection circuit is capable of routing signals between the plurality of circuit blocks and all of the interfaces or, if any one of the circuit blocks is nonfunctional, route signals between remaining circuit blocks and a predetermined set of the interfaces.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide circuits, methods, and apparatus for utilizing redundant circuitry on integrated circuits (ICs) that may increase manufacturing yields, while maintaining a predetermined set of interfaces for connection with external circuitry without drastically increasing die area and circuit complexity. In this manner, even though an IC may have defects which would otherwise render it inoperable, embodiments of the present invention allow the defects to be circumscribed or avoided while still maintaining a predetermined set of interfaces, thus providing for an operational circuit. Various embodiments further provide for sorting or separating devices based on their level of functionality or performance, which in turn depends on their number of defects and the desired number of interfaces.

Many of the circuits in high performance ICs, such as graphics processing units (GPUs), central processing units (CPUs), and other processors may include replicated circuit blocks that function in parallel. This is typically done to increase the performance, throughput, or data handling capability of a circuit. On any one IC, one or more of these parallel circuit blocks may be nonfunctional. For example, there may be defects in one or more of the circuit blocks caused by semiconductor processing or packaging errors, such as openings in contacts or vias, metal bridging, or other flaws. However, providing redundant circuit blocks and bypass circuitry to avoid nonfunctional circuit blocks or their associated pathways may not be enough, especially if the IC is intended for use with external circuitry.

One example of this may be an IC for use in a computer system, for instance, having a number of parallel memory controllers connected with pins of the IC package. These pins are designated for connection to external memory ICs by a customer. Even if the IC includes redundant circuitry to avoid the use of nonfunctional memory controllers should any of these circuit blocks have a defect, the IC manufacturer and the customer may want to maintain the same set of designated memory pins on the IC. By preserving the designated memory pins no matter which memory controllers fail within the IC, the manufacturer may avoid having to bin the ICs according to the various resulting interfaces of conventional fault-tolerant ICs. The manufacturer may also avoid the logistic complexity of selling different binned ICs to different customers and having multiple connection versions of an otherwise equally performing IC. Furthermore, maintaining the set of designated memory pins may allow the manufacturer to save packaging costs because the package size may be reduced, especially if there are several portions of a large integrated circuit with redundant circuits that utilize embodiments of the present invention.

An Exemplary Redundant Circuit for a Single Fault

Figure 1A:
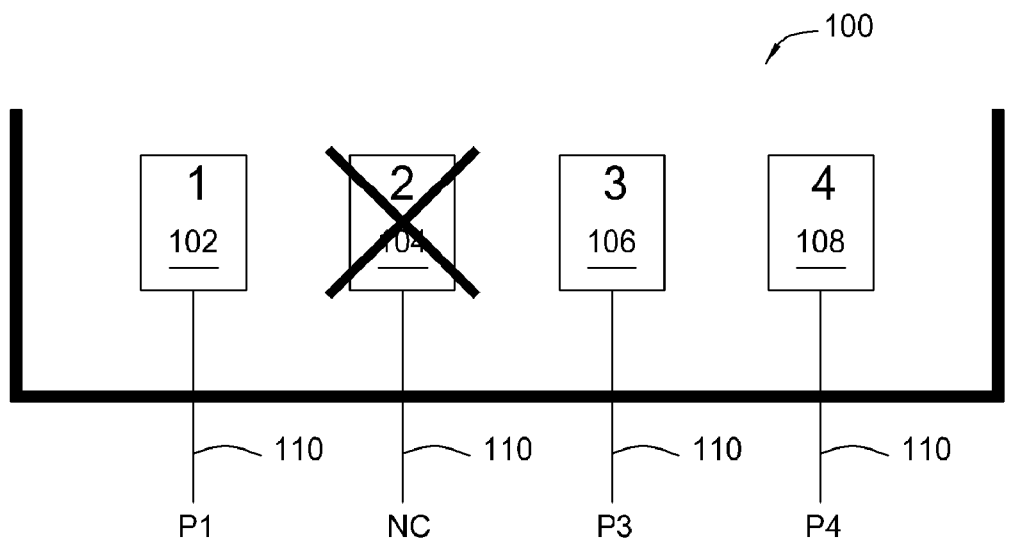
FIGS. 1A-B are prior art block diagrams of an integrated circuit portion for interfacing with external circuitry depicting a failure in two different circuit blocks and the corresponding interface.
Figure 1B:
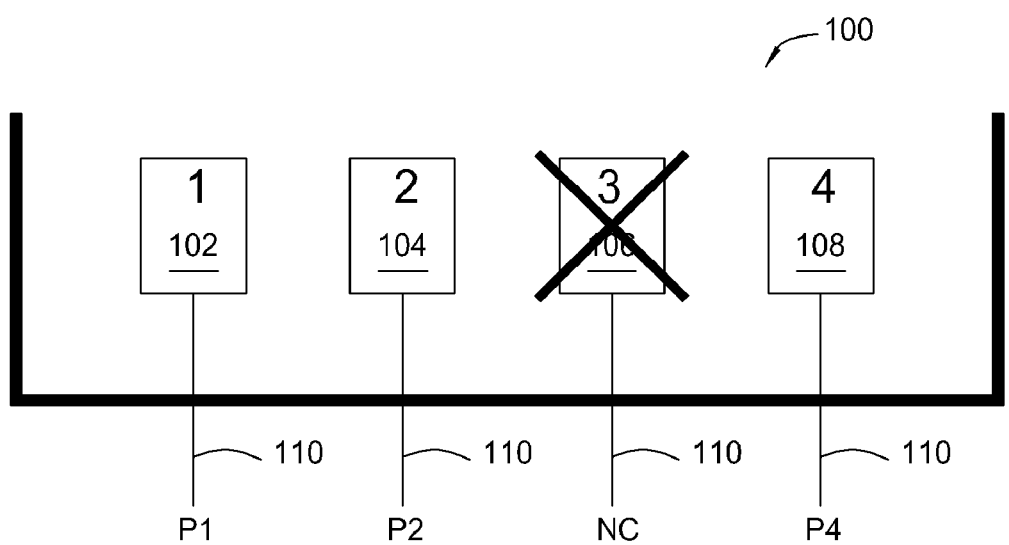
Figure 2:
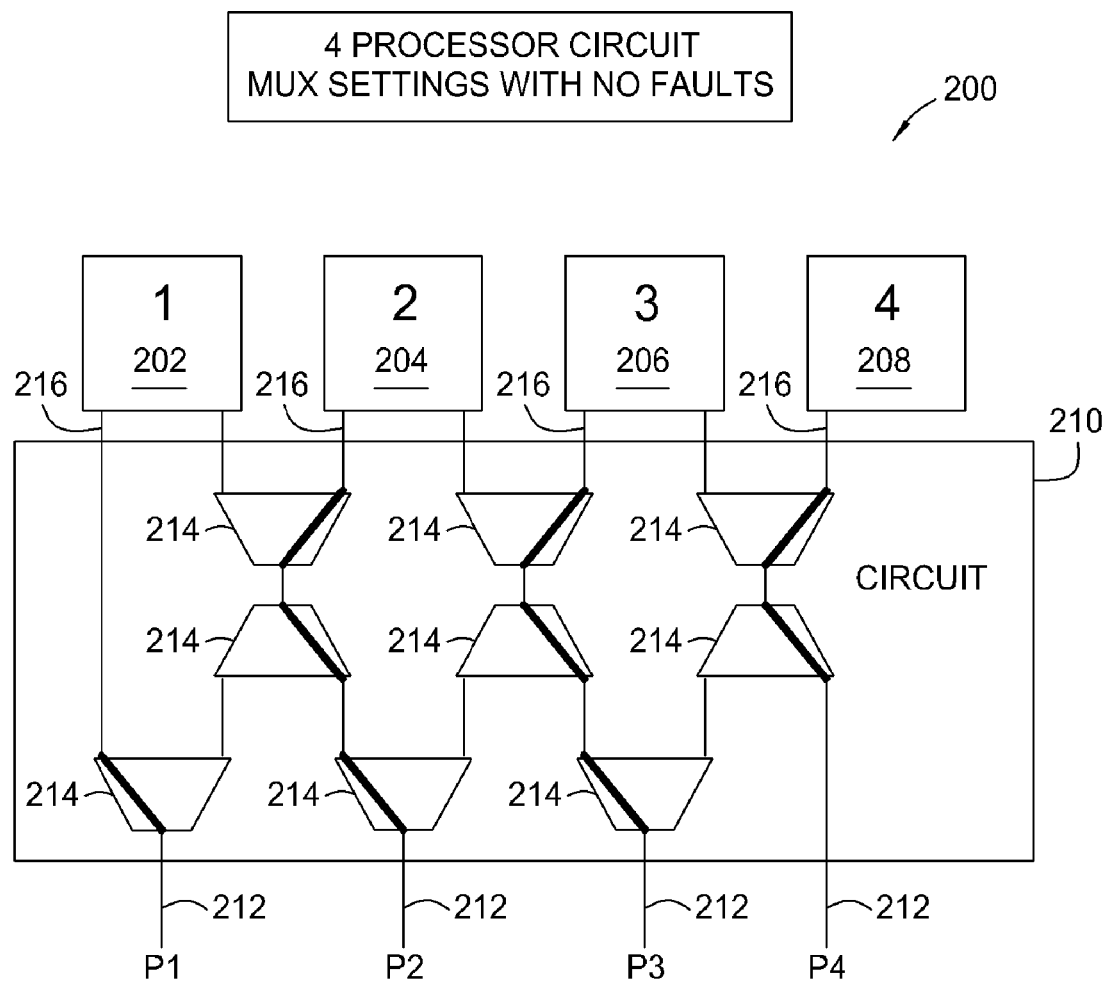
FIG. 2 is a block diagram illustrating an integrated circuit portion including a group of four functional parallel circuit blocks and selection circuitry tolerant of up to a single fault according to one embodiment of the invention.

FIG. 2 is a block diagram illustrating an IC portion 200 including a group of four parallel circuit blocks 202, 204, 206, 208 (e.g. memory controllers) and selection circuitry 210 tolerant of a single fault in accordance with one embodiment of the invention. Since all four circuit blocks 202, 204, 206, 208 are functional, the selection circuitry 210 may allow for pathways between the four circuit blocks 202, 204, 206, 208 and all four interfaces 212 labeled P1, P2, P3, and P4. The interfaces 212 may be inputs, outputs, or I/Os and may comprise any suitable connecting points, such as pins, bonding pads, balls of a ball grid array (BGA), terminals, nodes, or ports of any kind. For some embodiments, one of the pathways may be disabled on purpose to maintain a predetermined set of interfaces 212. For example, if the three leftmost interfaces are desired, then the selection circuitry 210 may disable the pathway to the interface 212 labeled P4.

The selection circuitry 210 may comprise several multiplexers 214 configured as shown, while other embodiments may include selection circuitry configured in a different manner, as those skilled in the art will recognize. The darkened line segments suggest potential pathways, and hence, multiplexer settings, for the signals 216 to reach the interfaces 212. Other configurations of multiplexers—or other switching devices, such as discrete transistors or analog switches—with similar functionality may be designed as those skilled in the art will acknowledge. Each of these multiplexers 214 may be a two-input multiplexer with a control signal. Each multiplexer 214 may also have an enable control in order to disable a pathway. Alternately, these multiplexers 214 may be specialized multiplexers, such as a one-hot multiplexer with an individual enable control for each input where only one of the enable controls at a time may select the input to be output by the multiplexer. The multiplexer control and enable signals are omitted from this figure and the other figures, while the enabled/selected pathways are emphasized with darkened line segments for clarity.

In other embodiments, each multiplexer 214 may be a three-input or larger multiplexer. For example, a 6:3 multiplexer (with 6 inputs and 3 outputs) that may be composed of three integrated 2:1 multiplexers may be used in the selection circuitry 210. Alternatively, the multiplexers 214 may all be one combined circuit.

It should also be noted that each of the signals 216 and multiplexer lines is shown as a single line for reasons of clarity. Typically, however, each of these lines represents multiple traces. For example, 100 to 2000 traces may typically be multiplexed between each circuit block and interface, depending on the exact circuit blocks in question. In addition, although only four circuit blocks 202, 204, 206, 208 are shown in FIG. 2, those skilled in the art will understand that the number of circuit blocks, the associated selection circuitry 210, and the number of interfaces 212 may be expanded or reduced.

Figure 3A:
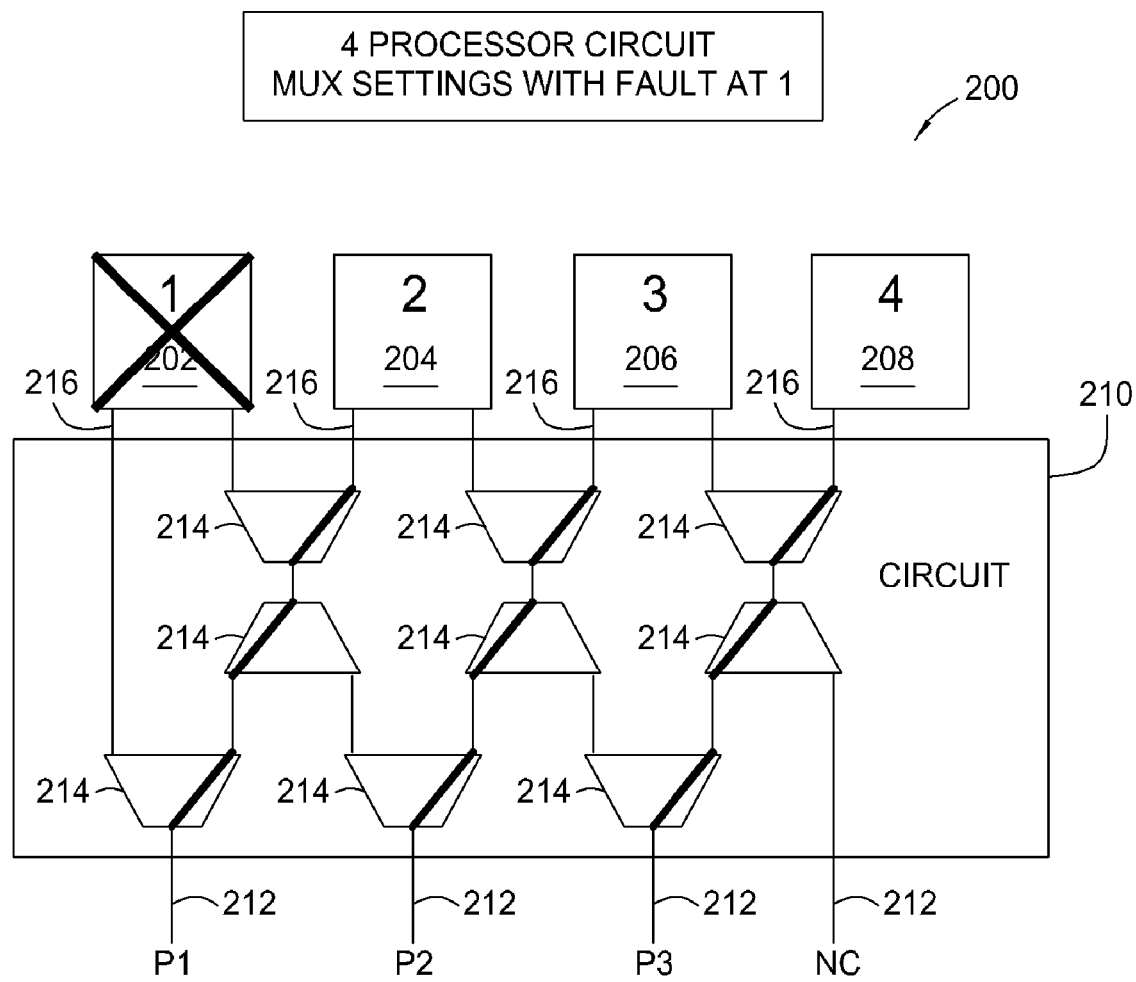
FIGS. 3A-D are block diagrams illustrating an integrated circuit portion including a group of four parallel circuit blocks with a different single nonfunctional circuit block in each diagram and selection circuitry configured to connect the remaining functional circuit blocks to the leftmost interfaces according to one embodiment of the invention.

In FIG. 3A, a fault has occurred in the first circuit block 202 of the IC portion 200. This fault may have occurred during manufacturing and may have been caught during testing of the device during wafer sort or final test. The location of the fault may be stored on the IC (or other storage location that may be accessed by the IC). These failure locations may be stored with any suitable means, such as blown fuses or bits in non-volatile memory or registers. Storing the fault location using laser-blown fuses may likely be used if the testing is performed during wafer sort, while non-volatile memory, such as electrically erasable programmable read-only memory (EEPROM) or flash memory, may be used to store the fault locations in final testing where the die may already be packaged. However the fault location is stored, the IC may include a lookup table (LUT) or other means in order to configure the selection circuitry 210 to select suitable pathways to maintain a predetermined set of interfaces 212.

When a circuit block, such as the first circuit block 202, is determined to be nonfunctional, not only should the block be disconnected from any input and output signals, but its clock or clocks may be shut off or disabled as well. This provides a reduction in chip power dissipation and switching noise. Also, bias lines may be disabled. Moreover, since excess power supply current consumption may result from an integrated circuit defect such as a short circuit, the power supplies to nonfunctional circuit blocks may be disconnected.

Knowing the location of the fault, the selection circuitry 210 may route signals 216 from the remaining functional circuit blocks 204, 206, 208 to the three leftmost interfaces labeled P1, P2, and P3. The darkened line segments suggest the routing through the multiplexers 214 for this embodiment. In this manner, the second circuit block 204 may be connected with the interface 212 labeled P1, the third circuit block 206 may be connected with the interface 212 labeled P2, and the fourth circuit block 208 may be connected with the interface 212 labeled P3. The interface 212 labeled NC (no connect) may not be routed to a circuit block. Thus, the predetermined set of interfaces 212 (the three leftmost interfaces 212 labeled P1, P2, and P3 in this example) may be maintained despite the first circuit block 202 being nonfunctional.

Figure 3B:
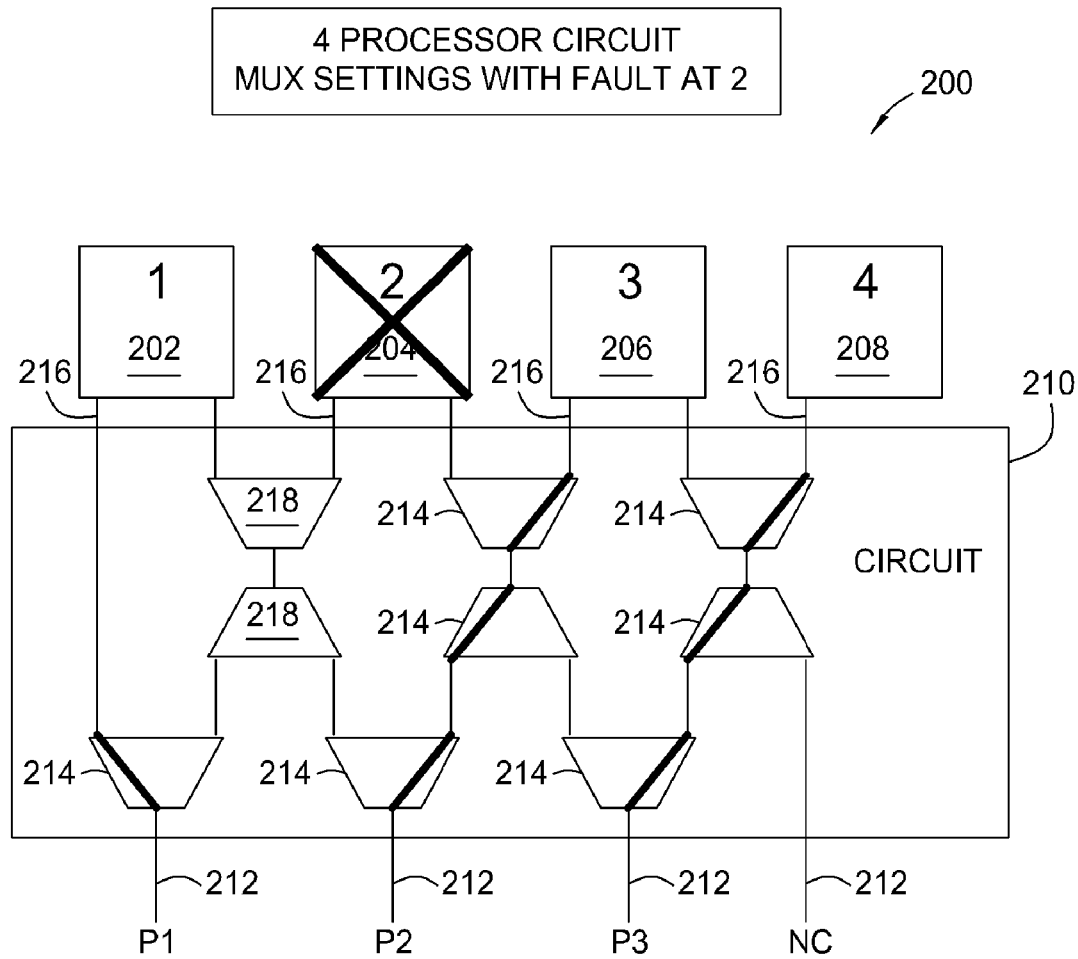

In FIG. 3B, a fault has occurred in the second circuit block 204 of the IC portion 200. Knowing the location of the fault, the selection circuitry 210 may guide signals 216 from the remaining functional circuit blocks 202, 206, 208 to the three leftmost interfaces labeled P1, P2, and P3. The darkened line segments suggest the routing through the multiplexers 214 for this embodiment. One or more of the multiplexers 218 may be disabled to prevent routing signals 216 from the nonfunctional circuit block 204 to one of the interfaces 212.

In this manner, the first circuit block 202 may be connected with the interface 212 labeled P1, the third circuit block 206 may be connected with the interface 212 labeled P2, and the fourth circuit block 208 may be connected with the interface 212 labeled P3. The interface 212 labeled NC should not be routed to a circuit block. Thus, the predetermined set of interfaces 212 (e.g. the three leftmost) may be maintained despite the second circuit block 204 being nonfunctional. To the world external to the IC, the functionality and interfaces 212 should be essentially no different in the example of FIG. 3B than in the example of FIG. 3A.

Figure 3C:
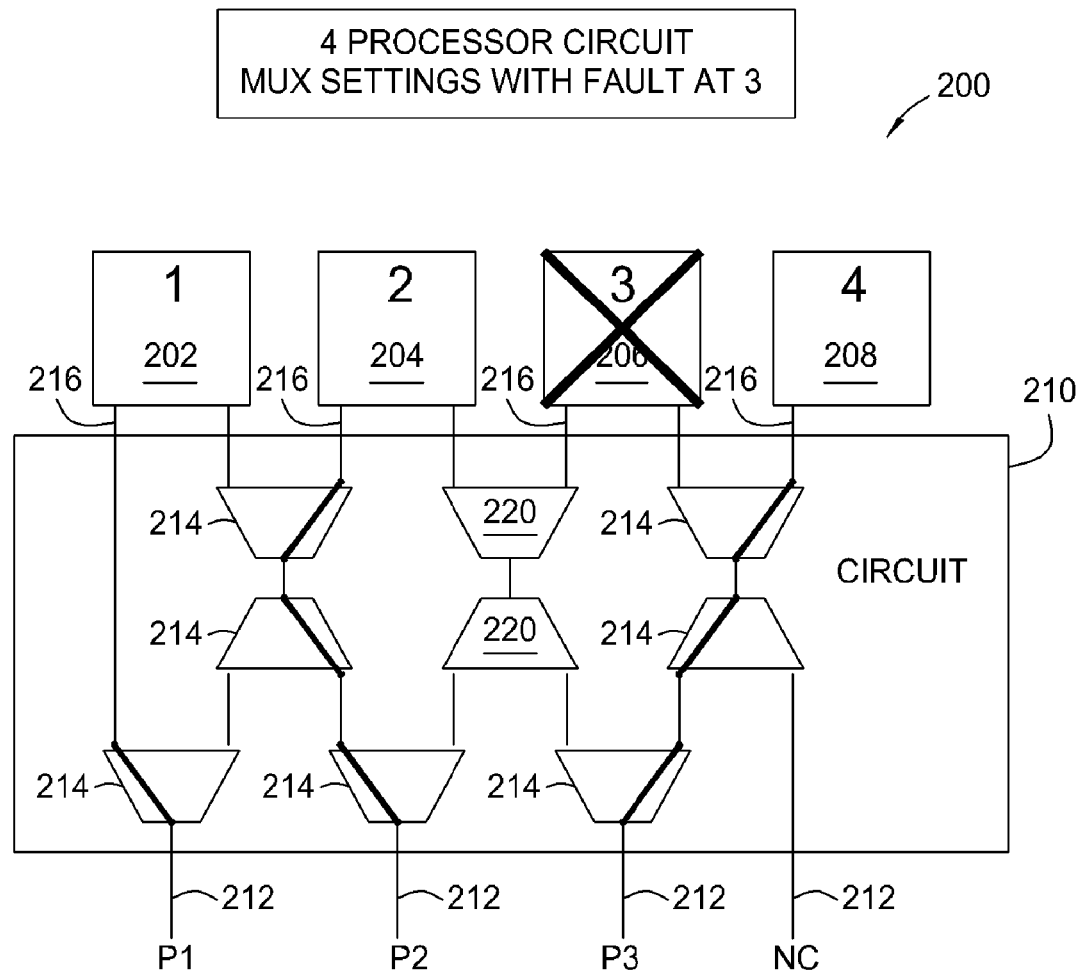

In FIG. 3C, a fault has occurred in the third circuit block 206 of the IC portion 200. Knowing the location of the fault, the selection circuitry 210 may direct signals 216 from the remaining functional circuit blocks 202, 204, 208 to the three leftmost interfaces labeled P1, P2, and P3. The darkened line segments suggest the routing through the multiplexers 214 for this embodiment. One or more of the multiplexers 220 may be disabled to prevent routing signals 216 from the nonfunctional circuit block 206 to one of the interfaces 212.

In this manner, the first circuit block 202 may be connected with the interface 212 labeled P1, the second circuit block 204 may be connected with the interface 212 labeled P2, and the fourth circuit block 208 may be connected with the interface 212 labeled P3. The interface 212 labeled NC should not be routed to a circuit block. Thus, the predetermined set of interfaces 212 (e.g. the three leftmost) may be maintained despite the third circuit block 206 being nonfunctional. To the world external to the IC, the functionality and interfaces 212 should be essentially no different in the example of FIG. 3C than in the examples of FIGS. 3A-B.

Figure 3D:
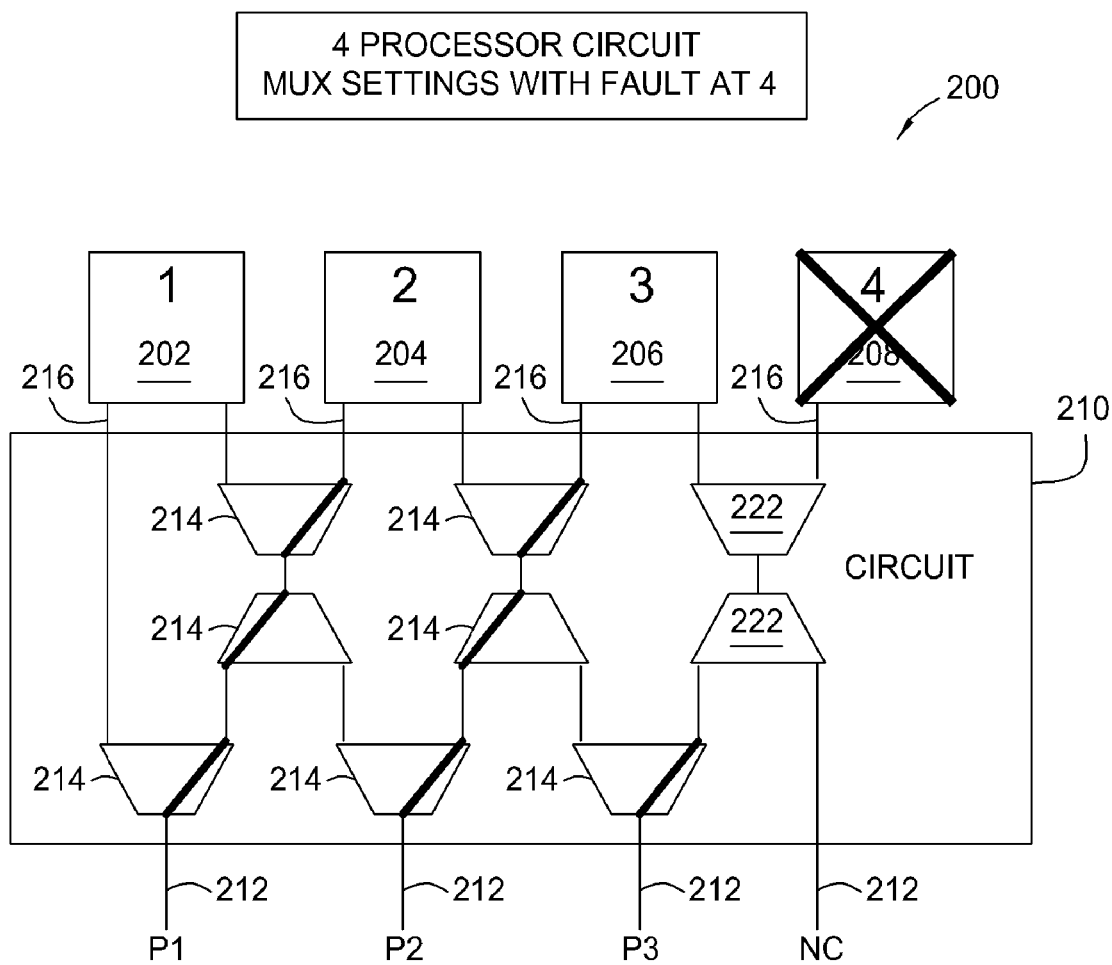

In FIG. 3D, a fault has occurred in the fourth circuit block 208 of the IC portion 200. Knowing the location of the fault, the selection circuitry 210 may steer signals 216 from the remaining functional circuit blocks 202, 204, 206 to the three leftmost interfaces labeled P1, P2, and P3. The darkened line segments suggest the routing through the multiplexers 214 for this embodiment. One or more of the multiplexers 222 may be disabled to prevent routing signals 216 from the nonfunctional circuit block 208 to one of the interfaces 212.

In this manner, the first circuit block 202 may be connected with the interface 212 labeled P1, the second circuit block 204 may be connected with the interface 212 labeled P2, and the third circuit block 206 may be connected with the interface 212 labeled P3. The interface 212 labeled NC should not be routed to a circuit block. Thus, the predetermined set of interfaces 212 (e.g. the three leftmost) may be maintained despite the fourth circuit block 208 being nonfunctional. To the world external to the IC, the functionality and interfaces 212 should be essentially no different in the example of FIG. 3D than in the examples of FIGS. 3A-C.

The overhead cost associated with this architecture may be one redundant circuit block, the plurality of multiplexers required in the selection circuitry, and additional routing of traces. This may be a small price to pay in terms of die area, particularly if the likelihood of a fault occurring somewhere in four (or more) circuit blocks is high.

In other embodiments of the present invention, there may be different numbers of circuit blocks divided into different numbers of groups. For example, if 256 functional circuit blocks are needed, 264 parallel circuit blocks may be divided into eight groups of 33 circuit blocks each, where 32 of each group may be used, and there may be one redundant circuit block in each group.

Another Exemplary Redundant Circuit for a Single Fault

Figure 4:
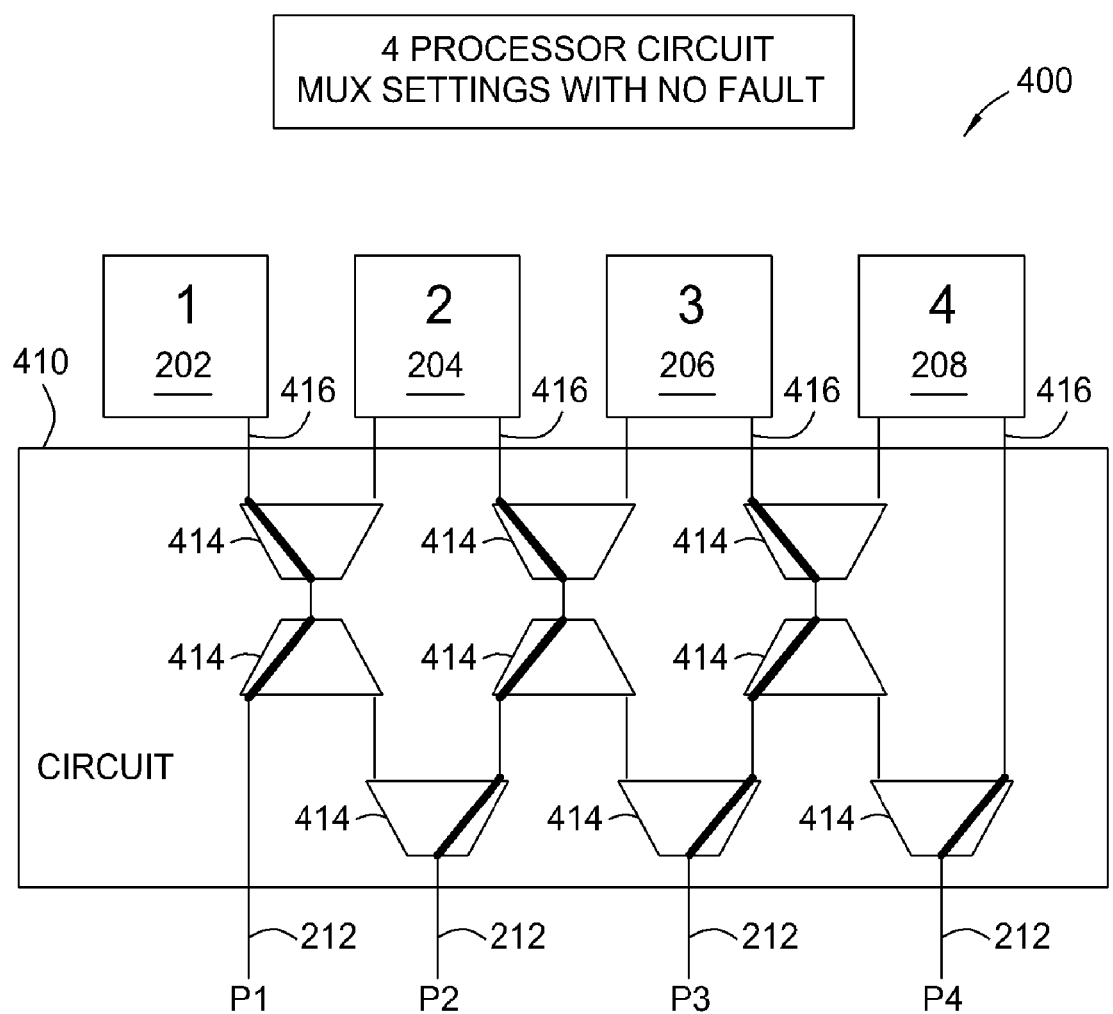
FIG. 4 is a block diagram illustrating an integrated circuit portion including a group of four functional parallel circuit blocks and selection circuitry tolerant of up to a single fault according to one embodiment of the invention.

Now that an example of a redundant circuit for a single fault capable of steering signals from a plurality of functional circuit blocks to the leftmost set of interfaces has been described, a complementary example will be described illustrating selection circuitry for directing the signals to the rightmost set of interfaces. FIG. 4 is a block diagram depicting an integrated circuit portion 400 including a group of four parallel circuit blocks 202, 204, 206, 208 and selection circuitry 410 tolerant of a single fault according to one embodiment of the invention. Since all four circuit blocks 202, 204, 206, 208 are functional, the selection circuitry 410 may allow for pathways between the four circuit blocks 202, 204, 206, 208 and all four interfaces 212 labeled P1, P2, P3, and P4. For some embodiments, one of the pathways may be disabled on purpose to maintain a predetermined set of interfaces 212. For example, if the three rightmost interfaces are desired, then the selection circuitry 410 may disable the pathway to the interface 212 labeled P1.

The selection circuitry 410 may comprise several multiplexers 414 configured as shown, while other embodiments may include selection circuitry configured in a different manner, as those skilled in the art will recognize. The darkened line segments suggest potential pathways, and hence, multiplexer settings, for the signals 416 to reach the interfaces 212. It should be noted that each of the signals 416 as shown may represent more than one signal from an individual circuit block.

Although only four circuit blocks 202, 204, 206, 208 are shown in FIG. 4, those skilled in the art will understand that the number of circuit blocks, the associated selection circuitry 410, and the number of interfaces 212 may be expanded or reduced.

Figure 5A:
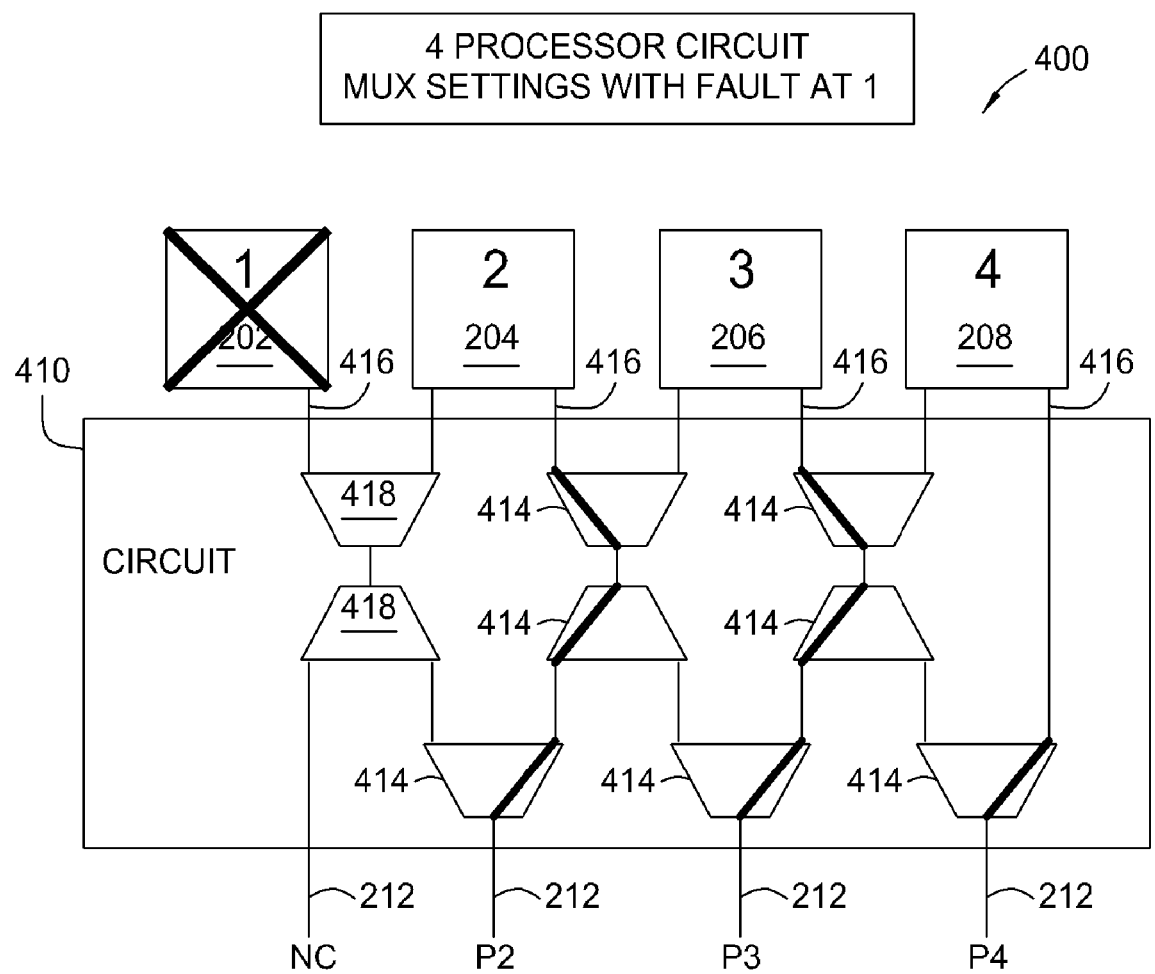
FIGS. 5A-D are block diagrams illustrating an integrated circuit portion including a group of four parallel circuit blocks with a different single nonfunctional circuit block in each diagram and selection circuitry configured to connect the remaining functional circuit blocks to the rightmost interfaces according to one embodiment of the invention.

In FIG. 5A, a fault has occurred in the first circuit block 202 of the IC portion 400. This fault may have occurred during manufacturing and may have been caught during testing of the device during wafer sort or final test. The location of the fault may be stored on the IC (or other storage location that may be accessed by the IC). These failure locations may be stored with any suitable means, such as blown fuses or bits in memory or registers.

Knowing the location of the fault, the selection circuitry 410 may route signals 416 from the remaining functional circuit blocks 204, 206, 208 to the three rightmost interfaces labeled P2, P3, and P4. The darkened line segments suggest the routing through the multiplexers 414 for this embodiment. One or more of the multiplexers 418 may be disabled to prevent routing signals 416 from the nonfunctional circuit block 204 to one of the interfaces 212. In this manner, the second circuit block 204 may be connected with the interface 212 labeled P2, the third circuit block 206 may be connected with the interface 212 labeled P3, and the fourth circuit block 208 may be connected with the interface 212 labeled P4. The interface 212 labeled NC may not be routed to a circuit block. Thus, the predetermined set of interfaces 212 (the three rightmost interfaces 212 labeled P2, P3, and P4 in this example) may be maintained despite the first circuit block 202 being nonfunctional.

Figure 5B:
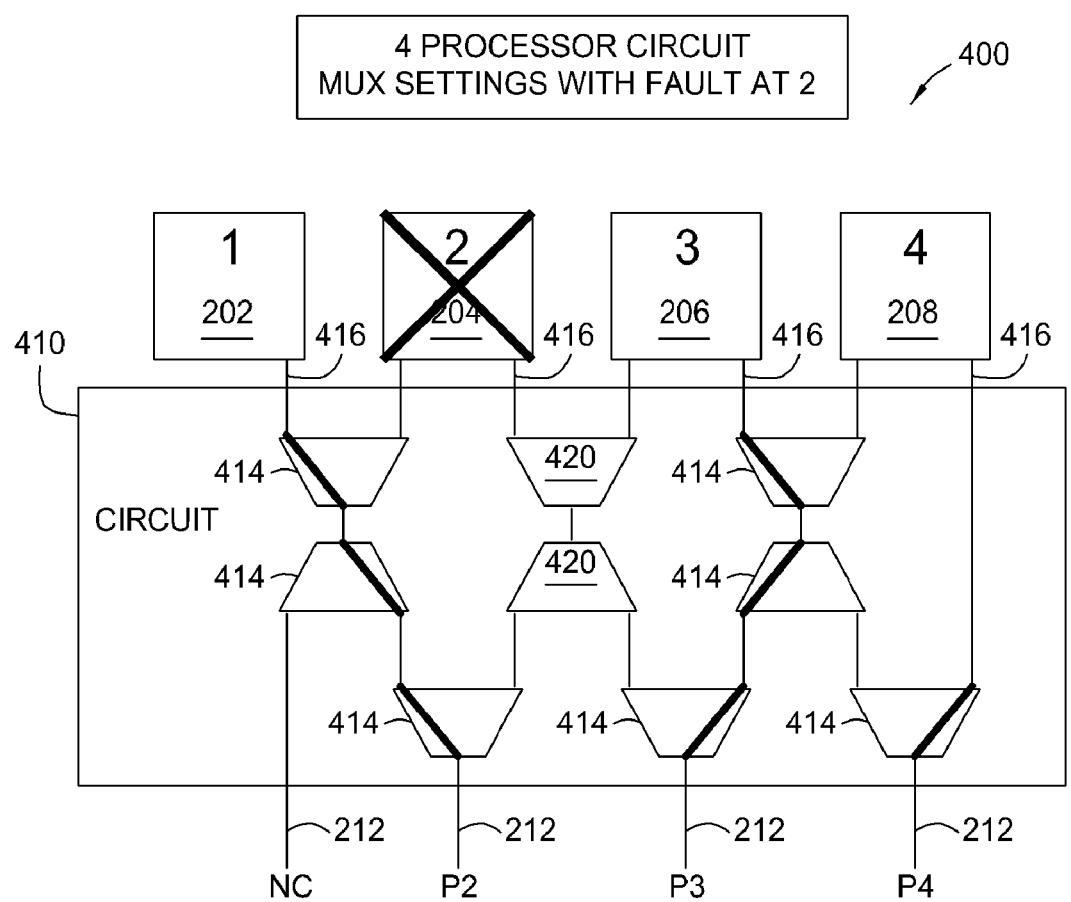
Figure 5C:
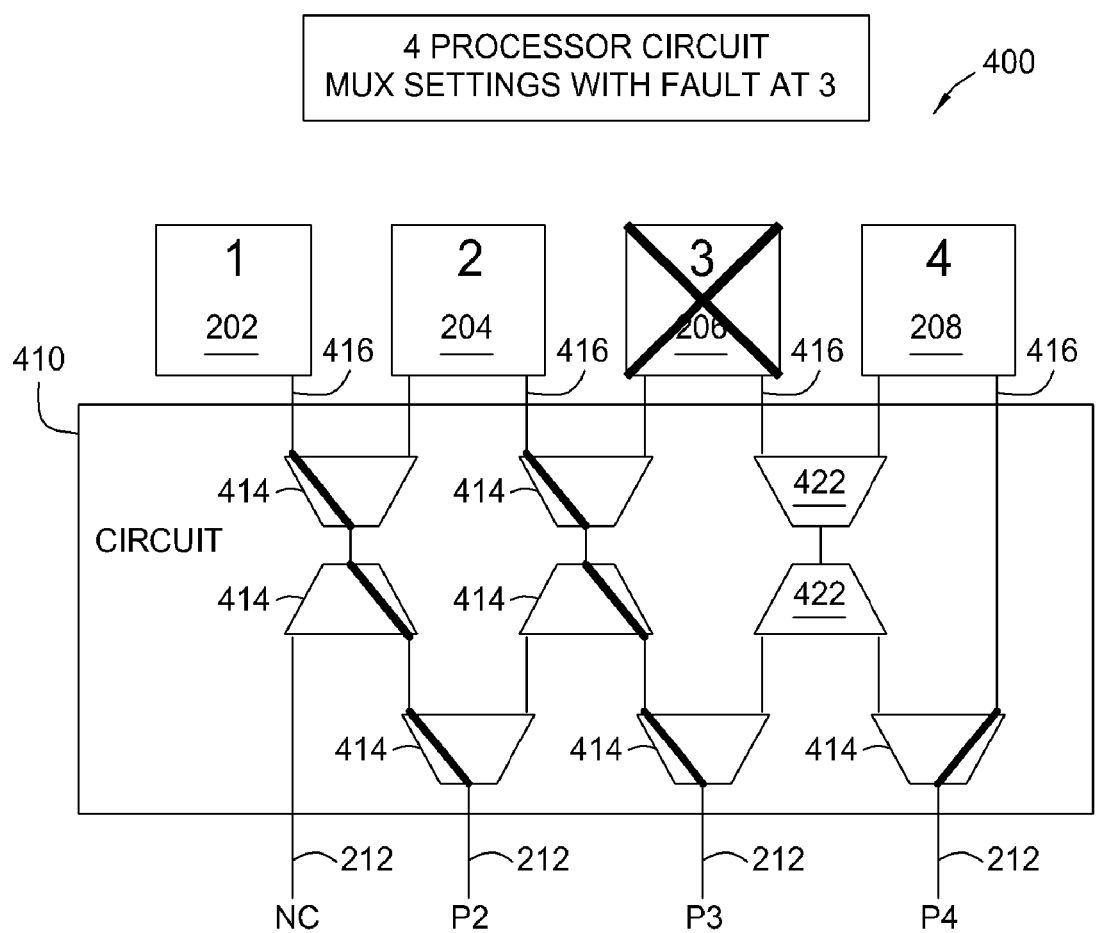
Figure 5D:
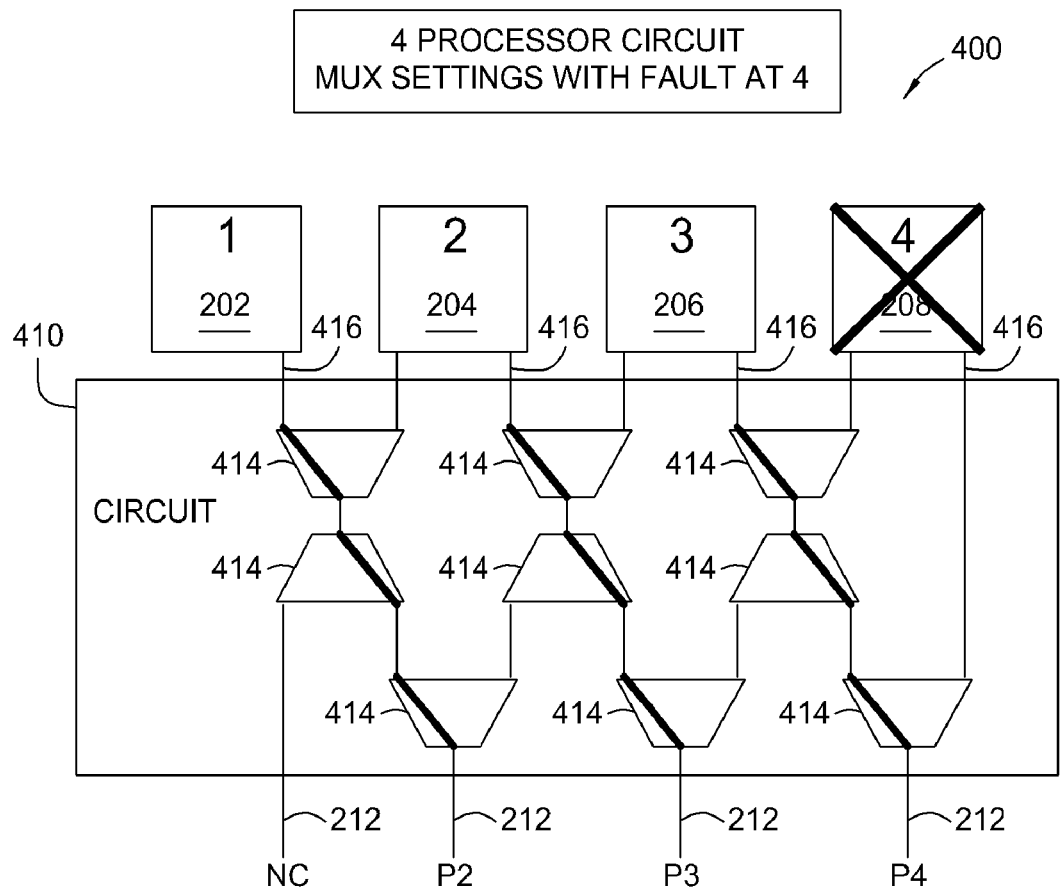

FIGS. 5B-D illustrate faults on different circuit blocks 204, 206, 208 within the same IC portion 400 and the routing of signals 416 that may occur from the remaining functional circuit blocks to the three rightmost interfaces labeled P2, P3, and P4 in accordance with some embodiments of the invention. To the world external to the IC, the functionality and interfaces 212 should be essentially no different in the examples of FIGS. 5B-D than in the example of FIG. 5A.

For some embodiments, a different predetermined set of interfaces may be desired than the leftmost or rightmost, perhaps for layout reasons within the IC. This may be accomplished by configuring the selection circuitry accordingly to selectively route signals between functional circuit blocks and the predetermined set of interfaces.

Also, the selection circuitry may be applied between parallel circuit blocks and interfaces functioning as inputs, outputs, or I/Os. In fact, a group of parallel circuit blocks may have more than one selection circuit associated with the group if multiple sets of predetermined interfaces are required.

An Exemplary Redundant Circuit for a Double Fault

In some cases, there may be more than one defective circuit block in a group of circuit blocks. In that case, it is advantageous to provide circuits, methods, and apparatus to compensate for two or more defective or nonfunctional circuit blocks in a group. The idea of utilizing redundant circuit blocks while maintaining a predetermined set of interfaces may be expanded to embodiments capable of tolerating more than a single fault. For example, FIG. 6 illustrates an integrated circuit portion 600 including a group of four parallel circuit blocks 202, 204, 206, 208 and expanded selection circuitry 610 tolerant of up to two faults in accordance with one embodiment of the invention.

Since all four circuit blocks 202, 204, 206, 208 may be functional, the selection circuitry 610 that may comprise several multiplexers 614 may allow for pathways between the four circuit blocks 202, 204, 206, 208 and all four interfaces 212 labeled P1, P2, P3, and P4. The interfaces 212 may be inputs, outputs, or I/Os and may comprise any suitable connecting points, such as pins, bonding pads, terminals, nodes, or ports of any kind. For some embodiments, one or more of the pathways may be disabled on purpose to maintain a predetermined set of interfaces 212. For example, if the two leftmost interfaces are desired, then the selection circuitry 610 may disable the pathways to the interface s 212 labeled P3 and P4.

Figure 6:
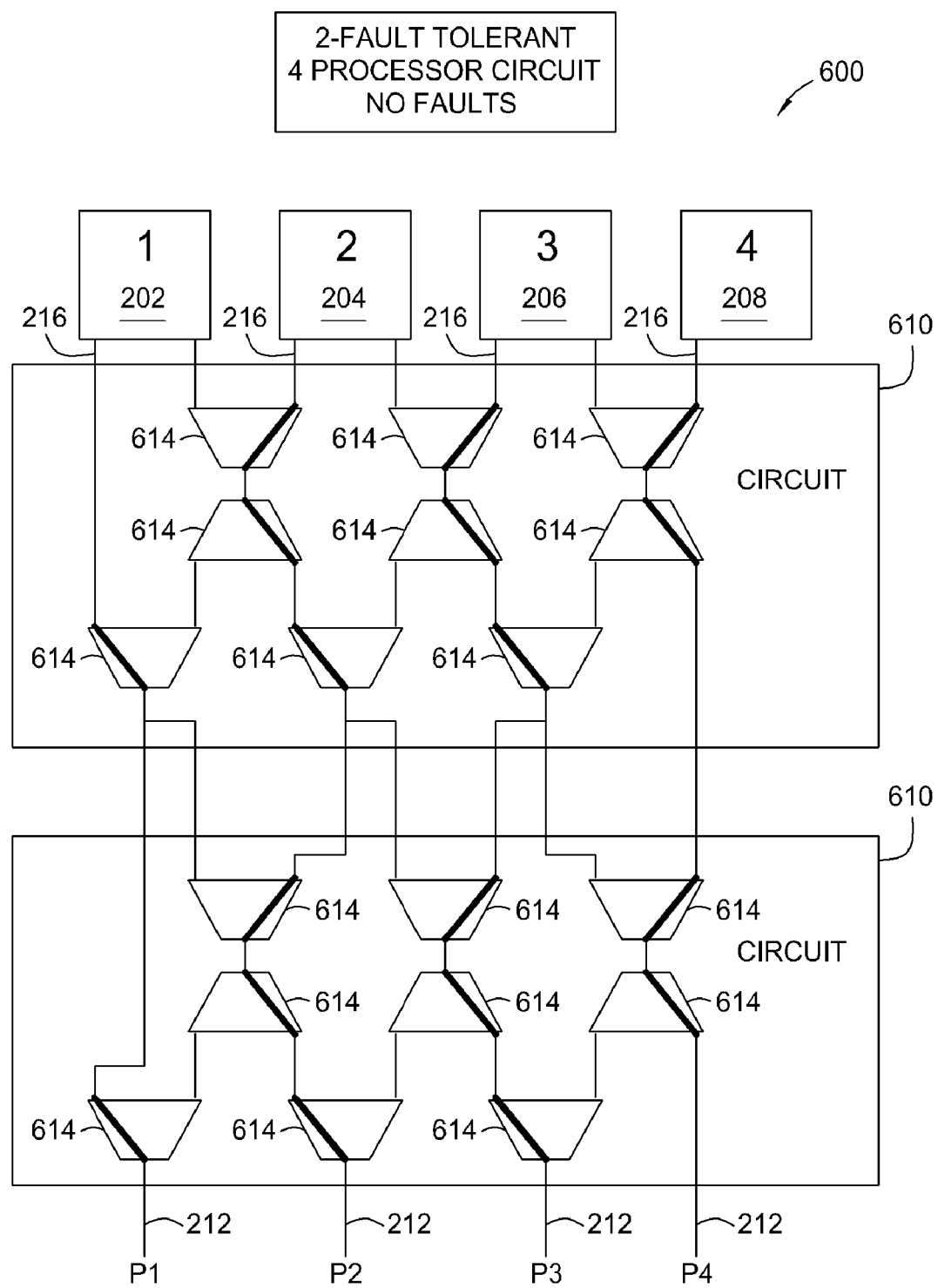
FIG. 6 is a block diagram illustrating an integrated circuit portion including a group of four functional parallel circuit blocks and selection circuitry tolerant of up to two faults according to one embodiment of the invention.

Although only four circuit blocks 202, 204, 206, 208 are shown in FIG. 6, those skilled in the art will understand that the number of circuit blocks, the associated selection circuitry 610, and the number of interfaces 212 may be expanded or reduced.

Figure 7:
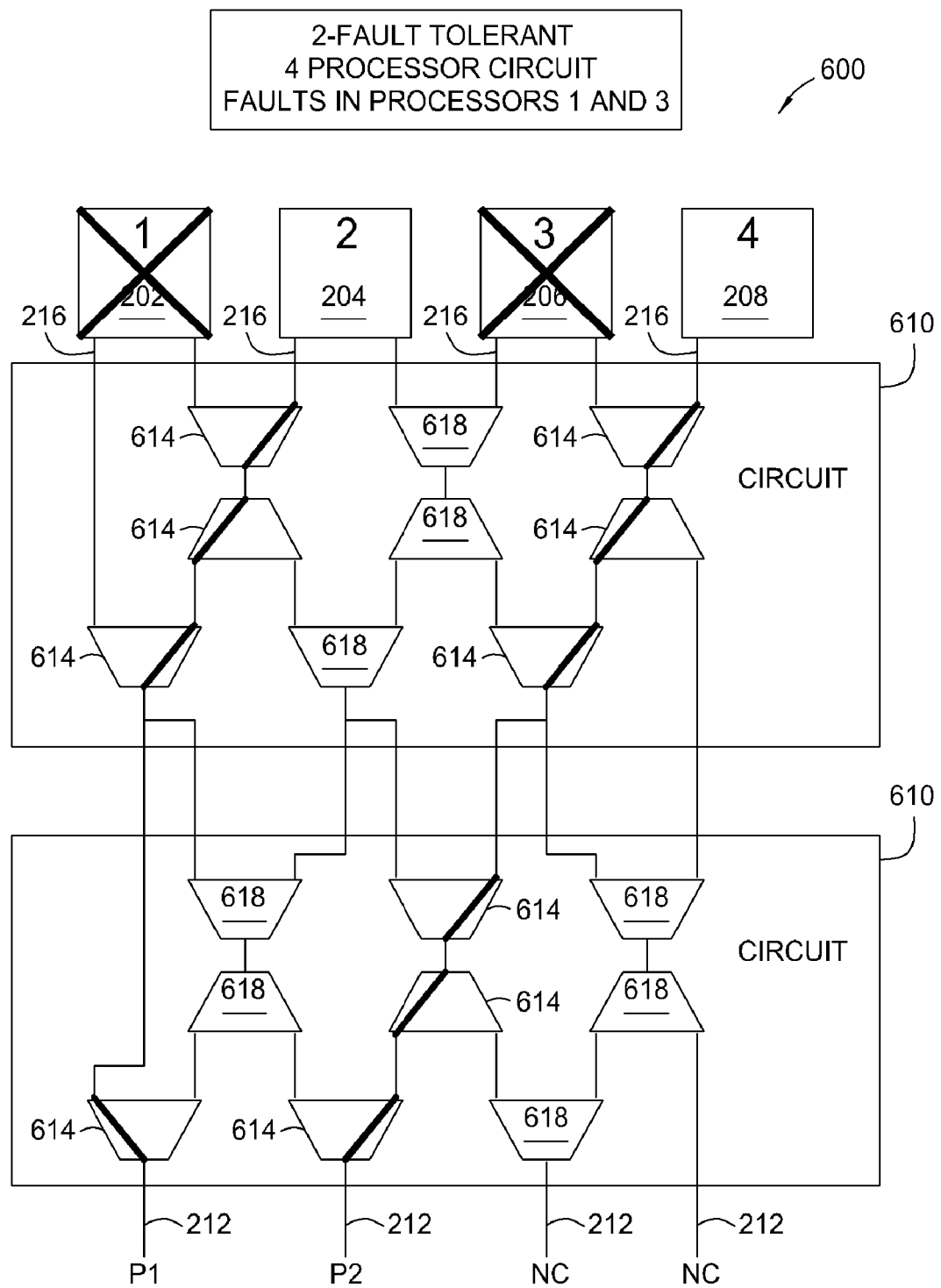
FIG. 7 is a block diagram illustrating an integrated circuit portion including a group of four parallel circuit blocks with two nonfunctional circuit blocks and selection circuitry configured to connect the remaining functional circuit blocks to the leftmost interfaces according to one embodiment of the invention.

In FIG. 7, two faults in the first 202 and third circuit block 206 have occurred in the IC portion 600. Knowing the locations of the faults, the selection circuitry 610 may route signals 216 from the remaining functional circuit blocks 204, 208 to the two leftmost interfaces labeled P1 and P2. The darkened line segments suggest the routing through the multiplexers 614 for this embodiment. One or more of the multiplexers 618 may be disabled to prevent routing signals 216 from the nonfunctional circuit blocks 202, 206 to the interfaces 212. In this manner, the second circuit block 204 may be connected with the interface 212 labeled P1 and the fourth circuit block 208 may be connected with the interface 212 labeled P2. The interfaces 212 labeled NC (no connect) may not be routed to a circuit block. Thus, the predetermined set of interfaces 212 (the two leftmost interfaces 212 labeled P1 and P2 in this example) may be maintained despite the first and third circuit blocks 202, 206 being nonfunctional.

For some embodiments, the interfaces 212 labeled NC may not even be made available since they may not be used. This omission may aid in fitting an IC according to embodiments of the invention into a smaller package.

Figure 8:
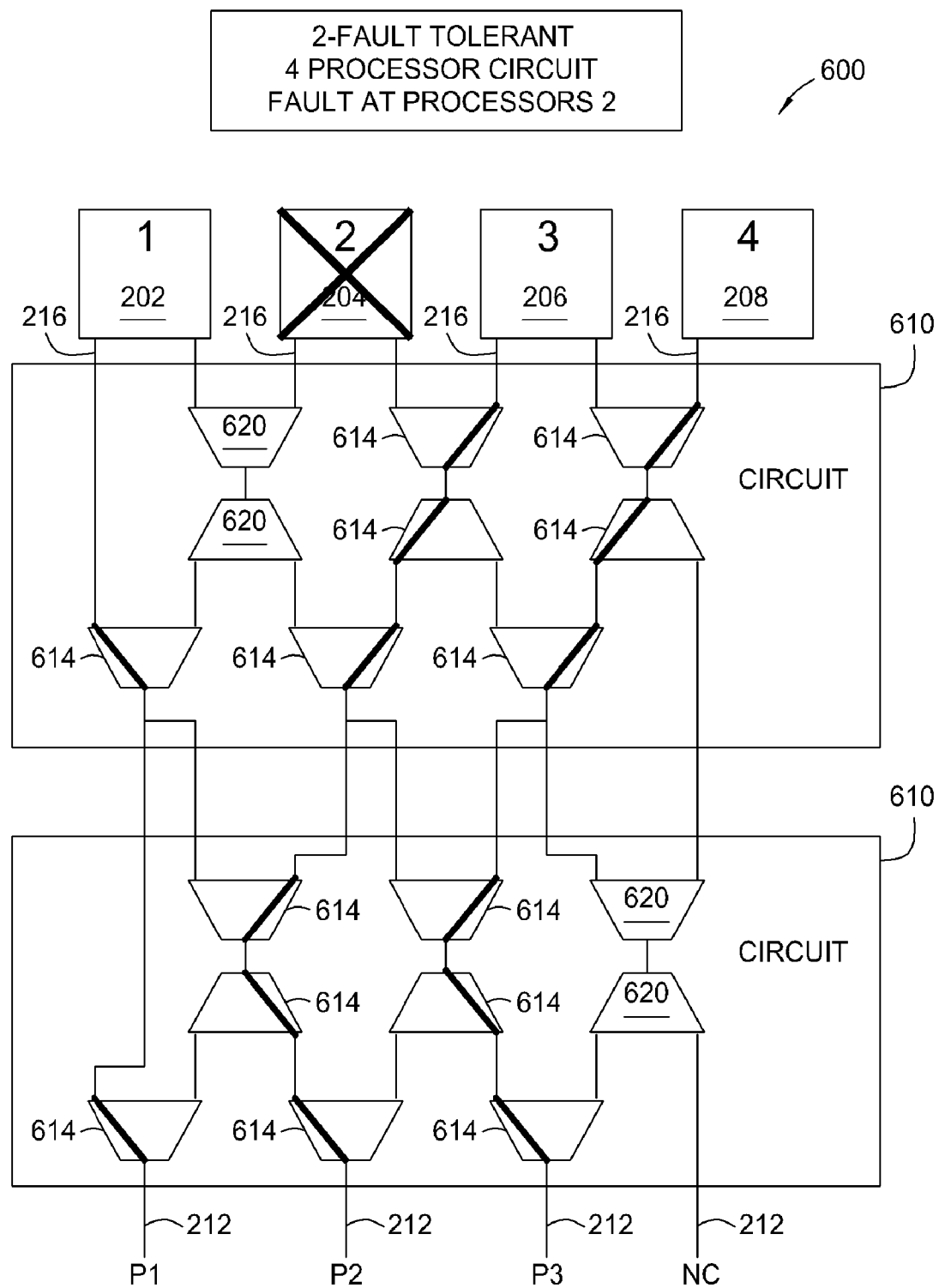
FIG. 8 is a block diagram illustrating an integrated circuit portion including a group of four parallel circuit blocks with one nonfunctional circuit block and selection circuitry configured to connect the remaining functional circuit blocks to the leftmost interfaces according to one embodiment of the invention.

The selection circuitry 610 of FIG. 6 may also support a single fault as shown in FIG. 8. This may allow for binning ICs based on the number of faults that have occurred if more than one predetermined set of interfaces is considered allowable. In FIG. 8, a fault has occurred in the second circuit block 204, for example. Knowing the location of the fault, the selection circuitry 610 may steer signals 216 from the remaining functional circuit blocks 202, 206, 208 to the three leftmost interfaces labeled P1, P2, and P3. The darkened line segments suggest the routing through the multiplexers 614 for this embodiment. One or more of the multiplexers 620 may be disabled to prevent routing signals 216 from the nonfunctional circuit block 204 to one of the interfaces 212.

In this manner, the first circuit block 202 may be connected with the interface 212 labeled P1, the third circuit block 206 may be connected with the interface 212 labeled P2, and the fourth circuit block 208 may be connected with the interface 212 labeled P3. The interface 212 labeled NC should not be routed to a circuit block. Thus, the predetermined set of interfaces 212 (e.g. the three leftmost) may be maintained despite the second circuit block 204 being nonfunctional.

Even though only a single fault has occurred in the example of FIG. 8, some embodiments may choose to preserve the two leftmost interfaces 212. In this case, one or more of the multiplexers 614 for routing a circuit block to the interface labeled P3 may be disabled. For some embodiments, the interfaces 212 labeled P3 and NC may be omitted.

An Exemplary Method of Testing and Sorting

On a particular integrated circuit, all the circuit blocks in an integrated circuit portion may be functional, and no redundant circuits should be needed. In that case, it may be desirable to include the functionality or performance of what would otherwise be a redundant, unused circuit. This may be done if integrated circuits having a reduced level of functioning or performance can also be sold or otherwise used. For example, if four parallel circuit blocks are included in an integrated circuit portion and all four circuits are functional, that device may be sold as a premium performance or highly functioning device. If three of the circuit blocks are functioning, the device may be sold as a device having a lower functionality or performance, perhaps at a lower price. Similarly, circuits having two or one functioning circuit blocks may be sold as even lower-level functioning devices, depending on the circuit in question.

Figure 9:
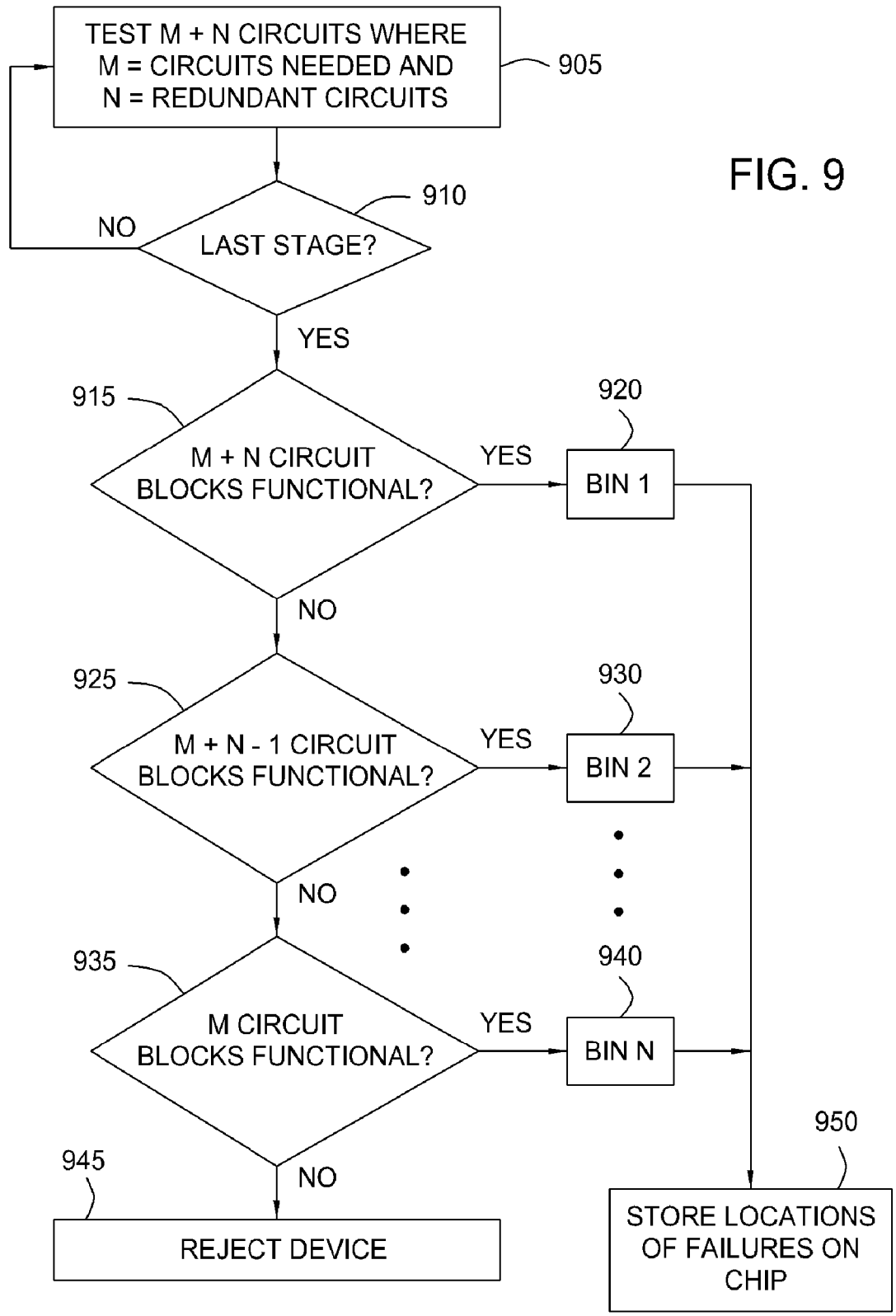
FIG. 9 is a flowchart illustrating a method of sorting devices based on their level of functionality according to one embodiment of the invention.

FIG. 9 is a flowchart illustrating a method of testing and sorting devices according to embodiments of the present invention based on their level of functionality. This testing may be done at various points in the manufacturing process, such as at wafer sort or final test, where wafer-sort testing is performed at the wafer level and final test is typically conducted after the wafer has been scribed and packaged. Final test may also occur after individual devices have been placed on a substrate, for example, as part of a hybrid package.

In step 905, M plus N circuit blocks may be tested in a particular integrated circuit portion or in a group of circuit blocks in such an integrated circuit portion, where M is the number of circuit blocks that are needed for a minimum level of functionality or performance while maintaining a predetermined set of interfaces, N is the number of potentially redundant circuits, and M plus N is the number of circuit blocks being tested. In step 910, it may be determined whether the last integrated circuit portion has been tested. If it has not, the next integrated circuit portion may be tested. Alternatively, portions may be tested in parallel. For each integrated circuit portion, there may be a different value for M and N.

Once the last integrated circuit portion has been tested, it may be determined in step 915 whether M plus N circuit blocks are functional throughout all portions tested. If they are, the device under test may be binned as a highest functioning or performing device, commonly referred to as a Bin 1 device, in step 920. In step 925, if M plus N−1 circuit blocks are functional, the device may be binned as a lower grade, or Bin 2 device, in step 930. Similarly, as fewer circuit blocks are functional as determined in step 935, the device may be binned as a lower bin device in step 940. If fewer than the minimum number of circuit blocks M are functional, the device should be rejected in step 945. Without the defect-tolerant circuits described above, only Bin 1 devices, or those having zero defects, would be classified as functional and pass manufacturing test. This method should enable devices with defects to yield usable products with reduced functionality or performance, but still maintain a predetermined set of interfaces.

If the device is placed in one of the bins in steps 920, 930, or 940, then in step 950 the location of any failures may be stored on the device or in a location accessible by the device being tested. Again, these locations may be stored as blown fuses or in memories, registers, or other memory storage devices. The stored locations may then be used to control the selection of the input and/or output multiplexers or other selection circuitry through the use of a lookup table or other suitable means.

While the foregoing is directed to embodiments of the present invention, other and further embodiments of the invention may be devised without departing from the basic scope thereof, and the scope thereof is determined by the claims that follow:

I claim:

1. A method of configuring an integrated circuit (IC) comprising a plurality of parallel circuit blocks, an equal number of interfaces, and selection circuitry configured to route a pathway between each of the circuit blocks and one of the interfaces, the method comprising:
   determining a number of nonfunctional circuit blocks in the plurality of parallel circuit blocks;
   if the number of nonfunctional circuit blocks is zero, controlling the selection circuitry to couple each of the plurality of parallel circuit blocks with a different one of the interfaces; and
   if the number of nonfunctional circuit blocks is less than or equal to a number of redundant circuit blocks in the plurality of parallel circuit blocks, controlling the selection circuitry to couple the remaining functional circuit blocks to a predetermined set of one or more interfaces no matter which circuit blocks are nonfunctional and disabling or disconnecting a clock to the nonfunctional circuit blocks.

2. The method of claim 1, wherein the IC with zero nonfunctional circuit blocks is a high performance device.

3. The method of claim 1, wherein the predetermined set of one or more interfaces is configured to connect with external circuitry in relation to the IC.

4. The method of claim 1, further comprising disconnecting power supply lines to the nonfunctional circuit blocks.

5. The method of claim 1, further comprising storing information indicating the nonfunctional circuit blocks.

6. The method of claim 5, wherein storing information indicating the nonfunctional circuit blocks comprises at least one of blowing fuses, writing to non-volatile memory, and loading into registers.

7. A computing system comprising:
one or more devices capable of external communication; and
at least one integrated circuit comprising:
a plurality of parallel circuit blocks that are parallel memory controllers;
one or more interfaces for communicating with the devices; and
a selection circuit to selectively route signals between the circuit blocks and the interfaces, wherein the selection circuit is capable of routing signals between the plurality of circuit blocks and all of the interfaces or, if any one of the circuit blocks is nonfunctional, route signals between remaining circuit blocks and a predetermined set of the interfaces.

8. The computing system of claim 7, wherein the one or more devices are memory devices.

9. The computing system of claim 7, wherein the at least one integrated circuit is a processing unit.

10. The computing system of claim 7, wherein the integrated circuit further comprises a storage element configured to indicate a location for each of the nonfunctional any one of the circuit blocks.

11. The computing system of claim 10, wherein the storage element comprises at least one of a blown fuse, non-volatile memory, and a register.

\* \* \* \* \*